US006440823B1

(12) United States Patent
Vaudo et al.

(10) Patent No.: US 6,440,823 B1
(45) Date of Patent: *Aug. 27, 2002

(54) LOW DEFECT DENSITY (GA, AL, IN)N AND HVPE PROCESS FOR MAKING SAME

(75) Inventors: Robert P. Vaudo, New Milford, CT (US); Vivek M. Phanse, Cambridge, MA (US); Michael A. Tischler, Phoenix, AZ (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/179,049

(22) Filed: Oct. 26, 1998

Related U.S. Application Data

(63) Continuation-in-part of application No. 08/984,473, filed on Dec. 3, 1997, now Pat. No. 6,156,581, and a continuation-in-part of application No. 08/955,168, filed on Oct. 21, 1997, which is a continuation-in-part of application No. 08/188,469, filed on Jan. 27, 1994, now Pat. No. 5,679,152.
(60) Provisional application No. 60/063,249, filed on Oct. 24, 1997, and provisional application No. 60/031,555, filed on Dec. 3, 1996.

(51) Int. Cl.[7] ............................................. H01L 21/20
(52) U.S. Cl. ...................................... 438/478; 483/22
(58) Field of Search ................. 438/478, 481, 438/483, 46; 117/2; 427/255.7, 248.1

(56) References Cited

U.S. PATENT DOCUMENTS

| 4,144,116 A |   | 3/1979 | Jacob et al. ................. 257/13 |
| 4,855,249 A |   | 8/1989 | Akasaki et al. .............. 437/81 |
| 5,290,343 A | * | 3/1994 | Nakamura ................... 438/46 |
| 5,385,562 A |   | 1/1995 | Moustakas .................. 437/107 |
| 5,563,422 A |   | 10/1996 | Nakamura et al. .......... 156/611 |
| 5,915,194 A | * | 6/1999 | Powell ....................... 438/478 |
| 5,962,875 A | * | 10/1999 | Motoki et al. ............... 257/103 |
| 5,985,687 A | * | 11/1999 | Bowers et al. .............. 438/977 |
| 5,993,542 A | * | 11/1999 | Yanashima et al. ........... 438/46 |
| 6,030,848 A | * | 2/2000 | Yuge et al. ................... 438/46 |
| 6,045,611 A | * | 4/2000 | Ishii et al. ................... 111/1.3 |

FOREIGN PATENT DOCUMENTS

EP       0 383 215 B1    6/1994    ........... H01L/33/00

OTHER PUBLICATIONS

N. R. Perkins, "Halide vapor phase epitaxy of gallium nitride films in sapphire and silicon substrates", *Mat. Res. Soc. Symp. Proc.* 395 (1996) pp. 243–248.

RJ Molnar, et al, "Growth of gallium nitride by hybride vapor–phase epitaxy" *J. Cryst. Growth*, 178 (1997) pp. 147–156.

J. S. Hwang, et al, "Heteroepitaxy of gallium nitride on (0001), (1012) and (1010) sapphire surfaces", J. Cryst. Growth, 142 (1994) pp. 5–13.

J.J. Nickl, et al, "Preparation of Epitaxial Galliumnitride" *Mat. Res. Bull.* 9 (1974) pp. 1413–1420.

Y. V. Melnik et al., "GaN, AlN, HVPE" *MRS Internet Journal*, 2 (1997) article 39.

S. Poroswski, et al., "GaN crystals grown in the increased volume high pressure reactors" *Mat. Res. Soc. Symp. Proc.* 449 (1997) pp. 35–40.

A. Usui, et al., "Thick GaN epitaxial growth with low dislocation density by hydride vapor phase epitaxy" *Jpn. J. Appl. Phys.* 36 (1997), pp. 899–902.

(List continued on next page.)

*Primary Examiner*—Savitri Mulpuri
(74) *Attorney, Agent, or Firm*—Oliver A. Zitzmann; Steven J. Hultquist; Margaret Chappuis

(57) ABSTRACT

A low defect density (Ga,Al,In)N material. The (Ga, Al, In)N material may be of large area, crack-free character, having a defect density as low as $3 \times 10^6$ defects/cm$^2$ or lower. Such (Ga,Al,In)N material is useful as a substrate for epitaxial growth of Group III-V nitride device structures thereon.

17 Claims, 10 Drawing Sheets

OTHER PUBLICATIONS

L. T. Romano, et al, "Structure of GaN films grown by hydride vapor epitaxy" *Appl. Phys. Lett.* 71 (1997) pp. 2283–2285.

A.T. Macrander and W.A. Bonner, "An evaluation of (100) sulfur doped InP for use as a first crystal in an x–ray double–crystal diffractometer", *Materials Letters*, 4(4), Jun. 1986, pp. 181–184.

A.T. Macrander and K.E. Strege, "X–ray double–crystal characterization of highly perfect Incas/InP grown by vapor––phase epitaxy", *J.Appl. Phys.* 59(2) Jan. 86, pp. 442–446.

B. Heying et al, "Role of threading dislocation structure on the x–ray diffraction widths in epitaxial GaN films" *Appl. Phys. Lett.* 68(5), Jan. 1996, pp. 643–645.

W. Qian et al, "Microstructural characterization of α–GaN films grown on sapphire by oganometallic vapor phase epitaxy", Appl. Phys. Lett. 66(10), Mar. 1995, pp. 1252–1254.

Y. Ohki et al, "Fabrication and properties of a practical blue–emitting Ga–N m–i–s diode", *Inst. Phys. Conf. Ser. No. 63, Japan*, 1981, pp. 479–484.

K. Hiramatsu et al, "Relaxation mechanism of thermal stresses in the heterostructure of GaN grown on sapphire by vapor phase epitaxy", *Jpn. J. Appl. Phys.*, vol. 32, 1993, pp. 1528–1533.

K. Naniwae, "Growth of single crystal GaN substrate using hydride vapor phase epitaxy", *Journal of Crystal Growth*, vol. 99, No. 1–4 part 1, 1990, pp. 381–384.

W. Seifert et al, "Study in the growth rate in VPE of GaN", *Journal of Crystal Growth*, vol. 52, (1981) pp. 257–262.

A. Shintani and S. Minagawa, "Kinetics of the epitaxial growth of GaN using Ga, HCL and $NH_3$", *Journal of Crystal Growth*, 22 (1974) 1–5.

H. P. Maruska, "Gallium nitride light emitting diodes", *Dissertation*, Nov. 1973, pp. 1–15.

* cited by examiner

SCHOTTKY CONTACT; >10 μm n⁻ GaN

OHMIC CONTACT; >10 μm n⁺ GaN

LOW DEFECT DENSITY (GA, AL, IN)N AND HVPE PROCESS FOR MAKING SAME

CROSS-REFERENCE TO RELATED APPLICATIONS

This claims the priority of U.S. provisional patent application No. 60/063,249 filed Oct. 24, 1997 in the names of Robert P. Vaudo, Joan M. Redwing, and Vivek Phanse for "LOW THREADING DEFECT DENSITY (Ga, Al, In)N AND HVPE PROCESS FOR MAKING SAME. This application is a also a continuation-in-part of U.S. application Ser. No. 08/984,473 filed Dec. 3, 1997 now U.S. Pat. No. 6,156,581 which in turn claims the priority of U.S. provisional patent application No. 60/031,555 filed Dec. 3, 1996 in the names of Robert P. Vaudo, Joan M. Redwing, Michael A. Tischler and Duncan W. Brown. This application is also a continuation-in-part of U.S. application Ser. No. 08/955,168 filed Oct. 21, 1997 in the names of Michael A. Tischler, Thomas F. Kuech and Robert P. Vaudo, which in turn is a continuation-in-part of U.S. patent application Ser. No. 08/188,469 filed Jan. 27, 1994 and issued Oct. 21, 1997 as U.S. Pat. No. 5,679,152.

BACKGROUND OF THE INVENTION

1. Field of the Invention

The present invention relates to a low defect density, substantially crack-free (Ga,Al,In)N material, useful for fabrication of Group III-V nitride devices, and also relates to a hydride vapor phase epitaxy (HVPE) process for making such low defect density, substantially crack-free (Ga,Al,In)N material.

2. Description of the Related Art (Ga,Al,In)N materials have long been considered for potential device applications, including UV-to-green light emitting diodes, lasers and detectors, as well as various other high temperature, high power, and/or high frequency electronic devices. The appeal of (Ga,Al,In)N materials for such applications is that the band gap of such material can be adjusted by correspondingly varying the composition, to yield band gap values in the range of from 1.9 to 6.2 electron volts (eV).

The potential of GaN and related materials associated with such wide energy bandgap enables a myriad of devices ranging from ultraviolet laser diodes to solar blind detectors. The key to realizing this potential is fabricating high quality material. The use of high quality lattice-matched native nitride substates would be an ideal template on which to fabricate such high quality material. Unfortunately, a suitable, high quality lattice-matched substrate for (Ga,Al,In)N does not exist. As a result, poor lattice-match materials such as sapphire have been used as a substrate in prior art attempts to grow suitable (Ga,Al,In)N layers for device fabrication. Due to the lattice mismatch, the (Ga,Al,In)N layers grown on sapphire or related materials are characterized by a large defect density. The art has proposed the use of buffer layers to compensate for the lattice-mismatch, but such approach has not been satisfactory in yielding useful base structures for device fabrication.

The majority of the defects in heteroepitaxially grown GaN are threading dislocations (TDs) which are associated with the misfit between the GaN and substrate. GaN grown on sapphire, silicon carbide or other similarly poorly lattice-matched substrate, typically contains greater than $10^8$ dislocations per $cm^2$ of surface. The dislocations form to accommodate the difference in lattice constant between the substrate and GaN material grown on the substrate. Defects/dislocations generated in the initial layer propagate to the active region of the device. In addition, similar dislocations, although lower in density, occur because of lattice constant differences between the individual layers of the device.

Although dislocations have long been known to be a serious problem for conventional Group III-V devices, only recently has there been direct evidence that dislocations are associated with undesirable materials characteristics and device problems in the III-V nitride system. A correlation exists between mixed character threading dislocations and non-radiative recombination centers and when the density of dislocations is greater than $\sim 10^9$ $cm^{-2}$, negatively charged dislocations can be the dominant scattering source in GaN.

Further, compositional and growth rate inhomogeneities, including V-defects, originate at the site of threading dislocations and, as may be shown by Electron Beam Induced Current (EBIC) investigation, dislocations may also serve as a path for Mg migration.

As an example of such defect-impacted performance character, for a (Ga,Al,In)N-based ultraviolet laser diode as an illustrative device structure, more than 2 orders of magnitude increase in the lifetime of the ultraviolet laser diode may be achieved by suitable formation of the GaN film material with a substantially reduced density of defects in the material.

Thus, the large lattice constant and thermal coefficient of expansion (TCE) mismatch between the epitaxial films and foreign substrates results in a high density of optically and electrically active defects which limit device performance and lifetimes. There is therefore a compelling need to lower the defect density in (Ga,Al,In)N materials.

With respect to the (Ga, Al, In)N material of the present invention as hereinafter described, the art generally has taught away from the process conditions for growth of (Ga, Al, In)nitride materials that are employed in the practice of the present invention. The art has, therefore, not achieved a dislocation density less than $10^7$ $cm^{-2}$ for crack-free areas larger than 1 $cm^2$. A summary of the relevant teachings of the art is therefore set out below, by which the advance and achievement of the present invention may be better appreciated.

Perkins et al. (N. R. Perkins, M. N. Horton, Z. Z. Bandic, T. C. McGill, and T. F. Kuech, Mat. Res. Soc. Symp. Proc. 395 (1996) 243) describes the effect of growth temperature on the crystallinity of a GaN film produced by HVPE and the use of growth temperatures in the range of 1030° C. to 1050° C. Such growth conditions are disclosed to minimize the full width half maximum (FWHM) of double crystal x-ray diffraction peaks over the temperature range of 850° C. to 1100° C. At the same time, the width of the photoluminescence excitation was not improved by using lower temperatures in this study. Perkins et al. recognized that "under non-optimum growth conditions, occasional pits are noted along the surface . . . [that] vary in size and distribution," and they observed cracking in films that were greater than 20 $\mu m$ in thickness.

Molnar et al. (R. J. Molnar, W. Gotz, L. T. Romano, N. M. Johnson, J. Cryst. Growth, 178 (1997) 147.) disclose that higher growth temperature and slower growth rates flattened out hexagonal islands, (i.e., produce smoother surface morphology).

Hwang et al. (J. S. Hwang, A. V. Kuznetsov, S. S. Lee, H. S. Kim, J. G. Choi, and P. J. Chong, J. Cryst. Growth, 142 (1994) 5) describe surface morphology improvements with increased growth temperature.

Nickl, et al. (J. J. Nickl, W. Just, and R. Bertinger, Mat. Res. Bull. 9 (1974) 1413) disclose that a growth temperature of 1030° C. optimized the ratio of near band edge photoluminescence emission (by a greater extent in the case of higher quality films) to deep level emission at ~2.2 eV.

Melnik et al., (Y. V. Melnik et al., MRS Internet Journal, 2 (1997) article 39) grew GaN on SiC substrates and etched away the SiC by reactive ion etching. The GaN dimensions were at most 7 mm per side, limited by TCE-related cracking.

Poroswski, et al. (S. Poroswski, et al., Mat. Res. Soc. Symp. Proc. 449 (1997) 35) report free-standing GaN as large as 0.7 $cm^2$ by high pressure sublimation.

Usui, et al. (A. Usui, et al., Jpn. J. Appl. Phys. 36 (1997) 899) describe low defect density thick HVPE GaN epitaxial growth producing a defect density of $6\times10^7$ defects/$cm^2$ at growth rates of up to 100 microns per hour. The GaN was grown on $SiO_2$ patterned substrates.

Romano, et al. (L. T. Romano, B. S. Krusor, and R. J. Molnar, Appl. Phys. Lett. 71 (1997) 2283) describes formation of GaN material with a defect density of $5\times10^7$ $cm^{-2}$ at the upper surface of the material and discloses that "many of the threading dislocations are not perpendicular to the surface; therefore, dislocation reactions can occur with increasing film thickness."

Thus, the art generally has taught away from the process conditions for growth of (Ga, Al, In)nitride materials that are employed in the practice of the present invention. The art also has not achieved a dislocation density less than $10^7$ $cm^{-2}$ for crack-free areas larger than 1 $cm^2$.

The art teaches the use of a two step growth process for the growth of GaN-based materials. Relative to the two step process of the present invention hereinafter more fully described, the first step in prior art processes is, however, carried out at substantially lower temperature (400–600° C.), the first step growth layer is much thinner (<200 nm in all cases), and the role of the first step in such prior art processes is to promote uniform surface coverage or nucleation on the substrate. Defect density less than $10^8$ $cm^{-2}$ have not been achieved using this method. The first layer in the prior art processes is amorphous or highly defective.

U.S. Pat. No. 5,563,422 issued Oct. 8, 1996 to S. Nakamura et al. describes a gallium nitride-based III-V compound semiconductor device having a gallium nitride-based III-V compound semiconductor layer on a substrate, and an ohmic electrode provided in contact with the semiconductor layer. The substrate may be sapphire or other electrically insulating substrate.

In the Nakamura et al. patent, the GaN layer provided on the substrate is formed by MOCVD. In practice of the teachings of the Nakamura et al. patent, the GaN nucleation layer thickness achievable is only on the order of 100 Å. The defect density in the nucleation layers is thought to be high, perhaps on the order of 1E11 $cm^{-2}$ or greater, and yields a defect density of 1E9 to 1E10 $cm^{-2}$ or greater in the subsequently grown GaN layer.

U.S. Pat. No. 5,385,562 issued Jan. 31, 1995 to T. D. Moustakas describes a method of preparing highly insulating GaN single crystal films by MBE by a two step growth process that includes a low temperature nucleation step and a high temperature growth step. The low temperature nucleation process is carried out at 100–400° C., resulting in an amorphous GaN nucleation layer of thickness between 200 and 500 Å. The defect density in the nucleation layer is 1E11 $cm^{-2}$ or greater, and yields a defect density of 1E9 to 1E10 $cm^{-2}$ or greater in the subsequently grown GaN layer.

Japanese Patent 60-256806 to Akasaki et al. describes an AlN nucleation step, grown at 600° C. to thicknesses of approximately 50 nm by MOCVD. Similarly, the defect density in the nucleation layer is thought to be high, e.g., 1E11 $cm^{-2}$ or greater, and yields a defect density of 1E9 to 1E10 $cm^{-2}$ or greater in the subsequently grown GaN layer.

It would be a substantial advance in the art to utilize substrates such as sapphire, on which (Ga,Al,In)N could be reliably and reproducibly grown with a substantially reduced defect density, as compared for example to the defect levels which are typically achieved by growth of epitaxial layers of GaN on sapphire, by molecular beam epitaxy (MBE), metal-organic vapor phase epitaxy (MOVPE), and prior art hydride vapor phase epitaxy (HVPE).

It therefore is an object of the present invention to provide a low defect density (Ga,Al,In)N material and a process for making same.

It is another object of the invention to provide a low defect density, substantially crack-free (Ga, Al, In)N material which is homogeneous over a large area.

It is still another object of the invention to provide (Ga,Al,In)N material on lattice-mismatched materials such as sapphire, which has a substantially reduced level of defects relative to (Ga,Al,In)N produced by the prior art.

It is another object of the invention to provide a low defect density, large area, substantially crack-free (Ga,Al,In)N material on lattice mismatched materials which are removable to enable low defect density, large area, substantially crack-free, free-standing (Ga,Al,In)N material.

It is yet another object of the present invention to provide (Ga, Al, In)N material on lattice-mismatched materials such as sapphire, with or without buffer layers, surface preparation, nucleation layers, or other intermediate layers between the substrate and the (Ga,Al,In)N material.

It is another object of the invention to provide a two-stage growth technique that overcomes the deficiencies of the prior art.

Other objects and advantages will be more fully apparent from the ensuing disclosure and appended claims.

SUMMARY OF THE INVENTION

The present invention relates to a low defect density, substantially crack-free (Ga,Al,In)N material, useful for fabrication of Group III-V nitride devices, and also relates to a vapor phase epitaxy process for making such low defect density, substantially crack-free (Ga,Al,In)N material.

In one aspect, the invention relates to a low defect density, large area, substantially crack-free (Ga, Al, In)N material. Such material may be of a free-standing type, or alternatively may be supported on a lattice-mismatched template material.

In another aspect, the present invention relates to a low defect density (Ga, Al, In)N material, formed on a substrate compatible therewith, in which defects of the (Ga, Al, In)N material are predominantly threading dislocations (TDs) that are angled with respect to the growth direction. In a specific embodiment, wherein the (Ga,Al,In)N material is GaN and the substrate comprises (0001) sapphire, the TDs are angled with respect to the [0001] growth direction.

In another aspect, the invention relates to a low defect density, substantially crack-free (Ga,Al,In)N material, which is homogeneous over large area, wherein the x,y dimensions preferably exceed 10 mm, and more preferably exceed 20 mm and most preferably exceed 40 mm.

In another aspect, the invention relates to a low defect density (Ga, Al, In)N material, formed on a substrate compatible therewith, in which defects of the (Ga, Al, In)N material are predominantly threading dislocations (TDs) that are angled with respect to the growth direction, as measured with respect to (Ga, Al, In)N growth on (0001) sapphire in the <0001> direction, wherein at least 10% of such dislocations have a tilt angle that is in the range of from about 0.1 to about 40°, more preferably with at least 40% of the dislocations having a tilt angle in the range of from about 0.1 to about 40°, and most preferably with at least 70% of the dislocations having a tilt angle in the range of from about 0.1 to about 40°.

As used in such context, the tilt angle is the included angle between the growth direction of the (Ga, Al, In)N being formed on the substrate and the line defined by a linear segment of a single threading dislocation in such material.

In another aspect, the present invention relates to a low defect density (Ga, Al, In)N material, formed on a substrate compatible therewith, in which defects of the (Ga, Al, In)N material are predominantly mixed type threading dislocations (TDs). In a specific embodiment, wherein the (Ga, Al, In)N m material is GaN and the substrate comprises (0001) sapphire, the Burgers vectors lie along either of +/−[1,0,−1,1], +/−[0,1,−1,1] or +/−[1,1,−2,1].

In another aspect, the present invention relates to a low defect density (Ga, Al, In)N material, formed on a substrate compatible therewith, in which defects of the (Ga, Al, In)N material are predominantly mixed type threading dislocations (TDs), wherein at least 60% of all threading dislocations have mixed character, more preferably at least 75% of all threading dislocations have mixed character, and most preferably at least 90% of all threading dislocations have mixed character.

In another aspect, the present invention relates to a substantially crack-free (Ga, Al, In)N material which enables the deposition or placement thereon of subsequent substantially crack-free (Ga,Al,In)N layers.

The substrate for the (Ga, Al, In)N material may comprise sapphire, silicon, silicon carbide, diamond, lithium gallate, lithium aluminate, zinc oxide, spinel, magnesium oxide, gallium arsenide, silicon-on-insulator, carbonized silicon-on-insulator, gallium nitride, etc., including conductive as well as insulating and semi-insulating substrates, twist-bonded substrates, compliant substrates, etc.

The low defect density material may be of significant thickness, e.g., greater than 100 micrometers in thickness (in the growth direction). The low defect density material has a defect density, measured on sapphire as a reference material, that is less than about $10^7$ defects/cm$^2$ at the upper surface of the material, and more preferably less than about $10^6$ defects/cm$^2$ at the upper surface of the material. Such defect densities are described as a number of threading dislocations per unit area at an upper surface of the material.

In a further aspect, the present invention relates to a method of forming such a low defect density material, by growing a (Ga, Al, In) N film on a compatible substrate by VPE at what have been traditionally viewed by the prior art as "sub-optimum" growth conditions for sufficient time and under sufficient growth conditions yielding a substantially crack free (Ga, Al, In) N film in which the defects are predominantly threading dislocations that are angled with respect to the growth direction.

For example, in any given set of process conditions for growing a (Ga, Al, In) N film, a process variable may be selectively varied to determine the "traditional optimal" process condition for that variable, at which the optimum surface morphology, crystallinity and defect density are obtained for thinner growth layers (less than 10 microns). Illustrative of such process variable are growth temperature, ratio of precursors for vapor-phase film formation, growth pressure and growth rate.

Once the traditional optimal process conditions of the selected process variable are determined, for best surface morphology, crystallinity and defect density of thinner base layers, "low surface mobility" process conditions for the selected variable, still in the vicinity of the traditional optimal value, can be determined, at which the defects in the vicinity of the film/substrate interface is a denser network of tangled defects (mixed defects) which transition with increasing film thickness to defects which are predominantly threading dislocations that are angled with respect to the growth direction. Such low surface mobility process conditions may thus be determined readily without undue experimentation by those of ordinary skill in the art, by selectively varying the HVPE process variable, and examining the defect structure and density in the resulting film material. Such process variables may for example include growth temperature and/or growth rate. The low surface mobility process condition may therefore include a lower growth temperature than the temperature that is utilized for traditional optimal growth, and/or a higher growth rate than the growth rate that is employed for traditional optimal growth. Other process conditions that may be alternatively or additionally employed to potential advantage in the practice of the invention are increased growth pressure conditions, and decreased V/III ratio of reactants for the growth process.

The substrate upon which the (Ga,Al,In)N material is deposited can be tailored to enhance the properties of the (Ga, Al, In) N material. The substrate material can be chosen so that it can be easily removed in situ or ex situ, to yield the (Ga, Al, In) N material as a free-standing film, by a process as described in co-pending U.S. patent application Ser. No. 08/955,168 filed Oct. 21, 1997 in the names of Michael A. Tischler, Thomas F. Kuech and Robert P. Vaudo for "Bulk Single Crystal Gallium Nitride and Method of Making the Same," and U.S. Pat. No. 5,679,152 issued Oct. 21, 1997; U.S. application Ser. No. 08/984,473 filed Dec. 3, 1997; U.S. provisional patent application No. 60/031,555 filed Dec. 3, 1996 in the names of Robert P. Vaudo, Joan M. Redwing, Michael A. Tischler and Duncan W. Brown, the disclosures of which are hereby incorporated herein by reference in their entireties.

The substrate material can also be separated from the (Ga,Al,In)N and/or chemically and/or mechanically removed from the (Ga,Al,In)N material.

The HVPE growth process used to form the (Ga, Al, In) N material in the method of the present invention may be carried out by reacting a vapor-phase (Ga, Al, In) chloride with a vapor-phase nitrogenous compound in the presence of the substrate, to grow the (Ga, Al, In) nitride layer on the substrate.

The nitrogen-containing compound may be any suitable compound, such as ammonia, hydrazine, azides, nitrites, amines, polyamines, etc.

The vapor-phase III-chloride advantageously is formed by contacting vapor-phase hydrogen chloride with molten (Ga, Al, In) to yield the vapor-phase (Ga, Al, In) chloride. The molten (Ga, Al, In) desirably is of very high purity, preferably having a purity of at least "5–9s" (i.e., 99.99999+%), and more preferably having a purity of at least "7–9s" (i.e., 99.9999999+%), as determined on a weight percentage basis of the total weight of the source metal material.

The (Ga, Al, In)N material grown by the aforementioned method may be grown at relatively high rate, e.g., at a growth rate of at least 10 μm/hour, more preferably of at least 50 μm/hour, and most preferably of at least 100 μm/hour, to produce a (Ga, Al, In)N material with a low threading dislocation defect density, e.g., less than $10^8$ threading dislocation defects/cm$^2$, more preferably less than $10^7$ threading dislocation defects/cm$^2$, and most preferably less than $10^6$ threading dislocation defects/cm$^2$.

In a specific method aspect, the invention relates to a method of forming a (Ga, Al, In)N material, comprising depositing a (Ga, Al, In)N material layer on a substrate or base structure by a HVPE growth process involving reaction of (Ga, Al, In), hydrogen chloride and ammonia, and conducted at a temperature of from about 985° C. to about 1010° C., at a growth rate of from about 50 to about 150 micrometers per hour, at a pressure of from about 10 to about 800 torr, and at a molar ratio of ammonia to hydrogen chloride of from about 20 to about 40.

The (Ga, Al, In)N material grown by the method of the invention may be used as a substrate for fabrication thereon of a microelectronic device or a device precursor structure, by a process including deposition of device layers by a suitable deposition technique, e.g., metalorganic chemical vapor deposition (MOCVD), molecular-beam epitaxy (MBE), etc.

The invention relates in another aspect to a microelectronic device or device precursor structure including a layer of the (Ga, Al, In)N material of the present invention. Such device or precursor structure may be an optical, electrical, optoelectronic, or other device, e.g., a device selected from laser diodes, LEDs, detectors, bipolar transistors, Schottky diode, permeable base transistors, high electron mobility transistors (HEMTs), vertical MISFETs, etc.

Other aspects and features of the invention will be more fully apparent from the ensuing disclosure.

BRIEF DESCRIPTION OF THE DRAWINGS

FIG. 1 is a cross section TEM image of a 100 μm thick HVPE GaN sample grown at 1000° C. (low surface mobility conditions), wherein

DETAILED DESCRIPTION OF THE INVENTION, AND PREFERRED EMBODIMENTS THEREOF

Figure 1A:
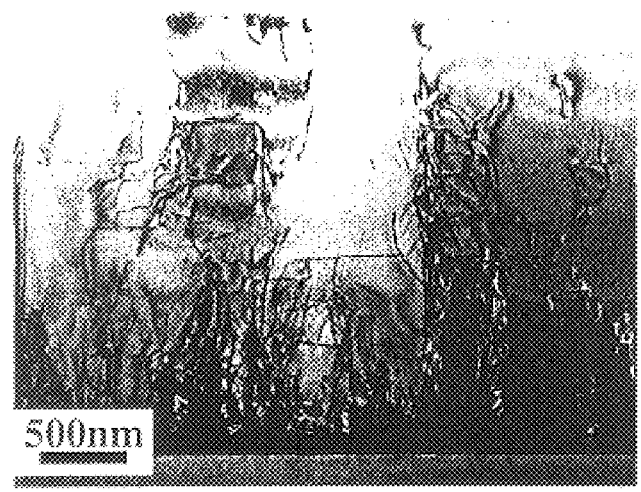
FIG. 1(a) shows the film/substrate interfacial region.

The disclosures of the following U.S. Patent Applications, U.S. Patent and literature reference are hereby incorporated herein by reference in their entireties: U.S. provisional patent application No. 60/063,249 filed Oct. 24, 1997 in the names of Robert P. Vaudo, Joan M. Redwing, and Vivek Phanse; U.S. application Ser. No. 08/984,473 filed Dec. 3, 1997; U.S. provisional patent application No. 60/031,555 filed Dec. 3, 1996 in the names of Robert P. Vaudo, Joan M. Redwing, Michael A. Tischler and Duncan W. Brown; U.S. application Ser. No. 08/955,168 filed Oct. 21, 1997 in the names of Michael A. Tischler, Thomas F. Kuech and Robert P. Vaudo; U.S. patent application Ser. No. 08/188,469 filed Jan. 27, 1994 and issued Oct. 21, 1997 as U.S. Pat. No. 5,679,152.

It will be understood that while the present invention is described hereinafter primarily with specific reference to the formation of GaN, the nitride material alternatively could be formed of other (Ga, Al, In)N species.

As used herein, the term (Ga, Al, In) is intended to be broadly construed to include the single species, Ga, Al, and In, and well as binary and ternary compositions of such Group III metal species. Accordingly, the term (Ga, Al, In)N comprehends the compounds GaN, AlN, and InN, as well as the ternary compounds GaAlN, GaInN, and AlInN, and the quaternary compound GaAlInN, as species included in such nomenclature. Accordingly, it will be appreciated that the ensuing discussion of GaN materials is applicable to the formation of other (Ga, Al, In)N material species.

The process of the present invention may be employed to produce a substantially crack-free, (Ga, Al, In)N material. The prior art has been unable to produce a large area, crack-free (Ga, Al, In)N material, as a result of thermal coefficient of expansion (TCE) differences associated with the growth of (Ga, Al, In)N material on lattice-mismatched substrates. These deficiencies of the prior art are overcome in the practice of the present invention, by forming the (Ga, Al, In)N material at process conditions different from those employed by the prior art, and that have surprisingly and unexpectedly been found to produce the superior crack-free and low defect density (Ga, Al, In)N.

Low surface mobility conditions are utilized to increase the tilt angle of threading dislocations from the growth direction, increase the percentage of mixed TDs, and reduce cracking in thick (Ga,Al,In)N material. Since large thickness of substantially crack-free (Ga,Al,In)N material can be produced (longer distance for TDs to meet) with TDs which are angled with respect to the growth direction (angled TDs are more likely to intersect with one another than TDs which run parallel), low surface mobility conditions produce lower TD density at the upper surface of the material, as compared with (Ga,Al,In)N material produced by traditional optimal conditions.

Low surface mobility process conditions, which are significantly different than traditional optimal conditions, enable crack elimination and defect density reduction compared with the prior art. Under low surface mobility process conditions, the time that a reactant molecule has available for incorporation into the crystal lattice is short compared with the surface mobility involved. Although the molecules incorporate, they do not have sufficient time to "find" the most thermodynamically stable site. Consequently, there is a trade-off between growth rate and surface mobility of adsorbed species.

In general, when deviating from traditional optimal conditions in the practice of the present invention, one may reduce the surface mobility by decreasing growth temperature, decreasing $NH_3$/HCl ratio, (when ammonia is used as the nitrogen source reagent for the HVPE reaction— reducing $NH_3$ flow since HCl flow over the Group III metal directly effects growth rate), and/or increasing growth pressure.

The present invention is also based on the discovery that a substantially crack-free, low defect density (Ga, Al, In)N material may be formed on a substrate compatible therewith, by an HVPE process conducted at specific low surface mobility growth conditions which produce a (Ga, Al, In)N material whose defects are predominantly threading dislocations (TDs) that are angled with respect to the growth direction, e.g., in the case of GaN as the (Ga, Al, In)N material and (0001) sapphire as the substrate, the TDs being angled with respect to the [0001] growth direction on such substrate. In this respect, low surface mobility conditions enhance the quantity and angle of tilted dislocations.

Both the angled dislocation and crack-free characteristics of the (Ga, Al, In)N material of the present invention are important to realizing low defect density (Ga,Al,In)N material because, dislocations which are angled with respect to the growth direction and each other, are more likely to intersect and annihilate one another, than are dislocations which run parallel to the growth direction and the ability to achieve large film thickness without cracking enables the dislocations more distance over which to annihilate.

FIG. 1(a),(b) and (c) shows TEM photomicrographs of GaN grown on (0001) sapphire in accordance with the method of the present invention. At 1000° C. growth temperature (low surface mobility conditions), the defects in the GaN film are angled with respect to the [0001] growth direction, as mechanism 1.

Figure 1B:
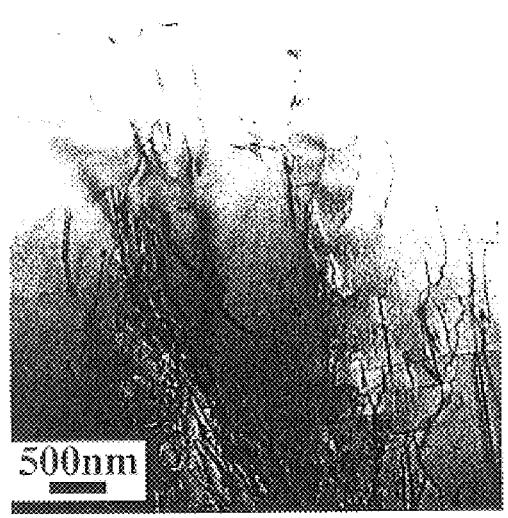
FIG. 1(b) shows the film material ~4 μm above the film/substrate interface.
Figure 1C:
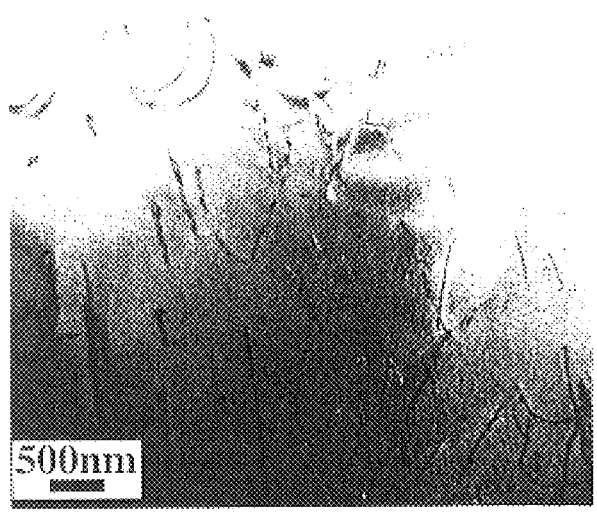
FIG. 1(c) shows the film material ~10 μm from the film/substrate interface.

FIG. 1 is a cross section TEM image of a 100 µm thick HVPE GaN sample grown under low surface mobility conditions (1000° C.), wherein FIG. 1(a) shows the film/substrate interfacial region, FIG. 1(b) shows the film material ~4 µm above the film/substrate interface, and FIG. 1(c) shows the film material ~10 µm from the film/substrate interface. As can be readily determined from the micrographs of FIG. 1, the predominant tilt angle of the TD population in the sample shown in FIG. 1 is well above 0.1° and well below 40° and continue to be angled several microns from the film/substrate interface.

Figure 2:
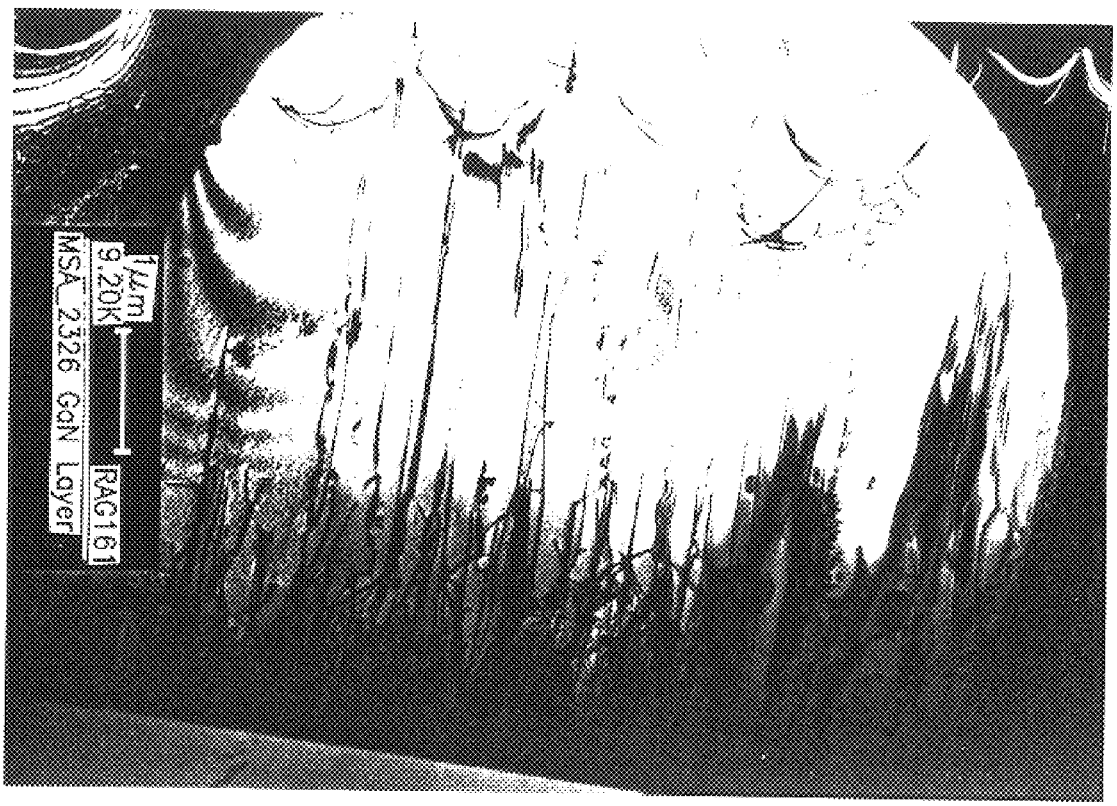
FIG. 2 is a cross-section TEM of HVPE GaN on (0001) sapphire grown at 1050° C. under otherwise similar growth conditions to those under which the FIG. 1 GaN material was grown (traditional optimal conditions).

To contrast with traditional optimal condtions, FIG. 2 is a cross-section TEM of HVPE GaN on (0001) sapphire grown at 1050° C. under otherwise similar growth conditions to those under which the FIG. 1 GaN material was grown. In FIG. 2, the TDs run parallel to the growth direction through a 10 µm thickness of the material.

Figure 3:
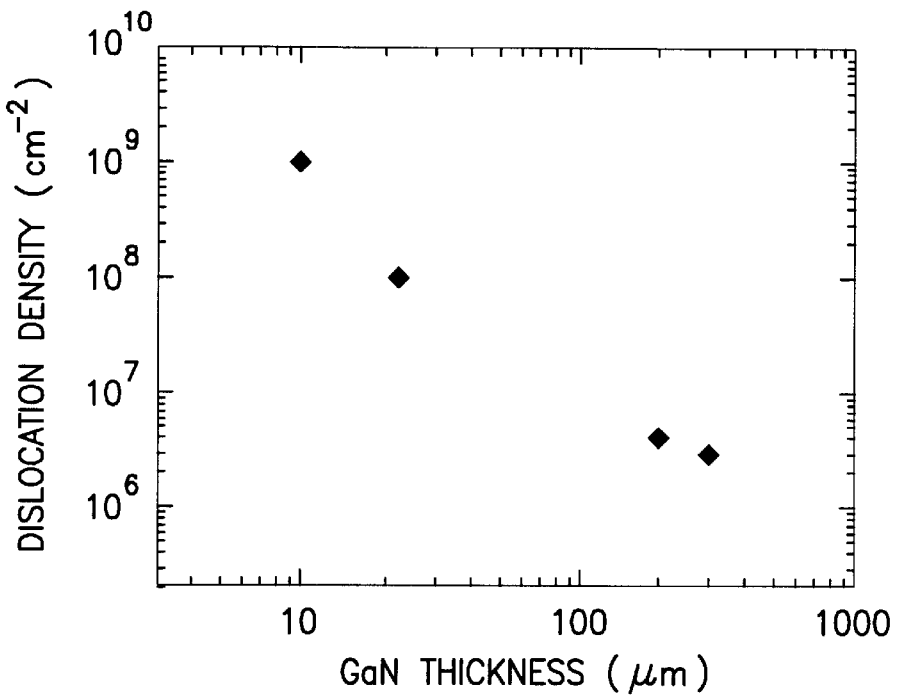
FIG. 3 shows the dislocation density for several HVPE GaN films, ranging from 10 to 300 μm in thickness.

FIG. 3 shows the dislocation density for several HVPE GaN films, ranging from 10 to 300 µm in thickness. The HVPE growth process of the invention has been found to permit substantial defect reduction, most dramatically in the first few microns of growth, but continuing for hundreds of microns. For example, in the growth of GaN on (0001) sapphire, at 300 µm film thickness, the defect density was reduced to 3–10$^6$ cm$^{-2}$ (measured by extensive plan view TEM) which is to our knowledge the lowest defect density heretofore achieved for heteroepitaxially, large area deposited GaN. FIG. 3 illustrates the importance of mechnism 2, annihilation over large film thickness. The above-described GaN layers were deposited directly on 2" diameter (0001) sapphire wafers by HVPE, and no buffer layers or nucleation layers were employed. The HVPE process enables high growth rates.

Thus, both the angled dislocation and large crack-free film thickness combine to produce (Ga,Al,In)N material which possesses lower defect density than that produced by the art.

The angled dislocations characteristic of the (Ga,Al,In)N material of the present invention are propagated and during the growth process (and increasing thickness of the material) such defects intersect with and annihilate one another, to produce a low defect density material. This is a surprising development in the art. See for example W. Qian, et al., Appl. Phys. Lett. 66 (1995) 1252, which reflects the inability of the prior art to cause such angled defect growth; in that article, the researchers report an attempt to cause tilting of the dislocations by use of a strained layer superlattice beneath a GaN layer, but the GaN material grew without any occurrence of the desired "bend-over" of the dislocations.

In a preferred embodiment of the invention, the low defect density (Ga, Al, In)N material is formed on a substrate compatible therewith, in which defects in the (Ga, Al, In)N material are predominantly threading dislocations (TDs) that are angled with respect to the growth direction by a tilt angle that is predominantly (for at least 10% of the defects, more preferably for at least 40% of the defects, and most preferably for at least 70% of the defects) in the range of from about 0.1 to about 40°.

The (Ga, Al, In)N material may be initially formed on a substrate, and the substrate may be removed to provide a free-standing (Ga, Al, In)N article. The free-standing (Ga, Al, In)N article may then serve as an independent base substrate for device fabrication. The free-standing (Ga, Al, In)N article may be further treated to remove the initial monolayers of the (Ga, Al, In)N material to effect a substrate with a lower defect density than that claimed herein.

Such removal of the initially employed substrate from the (Ga, Al, In)N material may be carried out in any suitable manner, either in situ or ex situ, by any suitable means and/or method, such as separation of the nitride material and substrate, or chemical and/or mechanical removal techniques.

As one example, the substrate may be removed in situ from the (Ga, Al, In)N base layer after the (Ga, Al, In)N material has been formed on the substrate, in the growth reactor and at or near temperature (of the (Ga, Al, In)N material formation) as for example by the method disclosed in the co-pending U.S. patent application Ser. No. 08/955,168 filed Oct. 21, 1997 in the names of Michael A. Tischler, Thomas F. Kuech and Robert P. Vaudo for "Bulk Single Crystal Gallium Nitride and Method of Making the Same," the disclosure of which hereby is incorporated herein by reference in its entirety.

As another example, the substrate may be removed from the (Ga, Al, In)N material by subsurface implantation of hydrogen or other suitable implantation species in the substrate before formation of the (Ga, Al, In)N material thereon. The substrate/(Ga,Al,In)N material may thereafter be subjected to elevated temperature and pressure conditions suitable for causing the implanted hydrogen to exert pressure on the interface between (Ga,Al,In)N material and the substrate to cause the separation of the (Ga,Al,In)N material and the substrate from one another, to yield a free-standing (Ga, Al, In)N material.

Such separation method may be practiced as an in situ technique or alternatively as an ex situ technique.

As yet another example of removing the substrate from the (Ga, Al, In)N material from the substrate, thermal decomposition of a thin layer of (Ga, Al, In)N material using laser irradiation may be employed to separate the (Ga,Al,In)N material from the substrate. The laser energy must be sufficiently high to permit absorbtion in a thin layer of the (Ga,Al,In)N material and thermally decompose the (Ga,Al,In)N material, yet sufficiently low to permit transmission through the substrate.

The resulting separated and free-standing (Ga,Al,In)N material may be of any suitable thickness, as for example a thickness, e.g., >100 $\mu$m, suitable for use of the (Ga,Al,In)N material as a bulk substrate for device fabrication, or at lesser thicknesses as a constituent layer for use in device applications, e.g, as a layer to be bonded or otherwise provided on an underlying substrate or device precursor structure.

Figure 4:
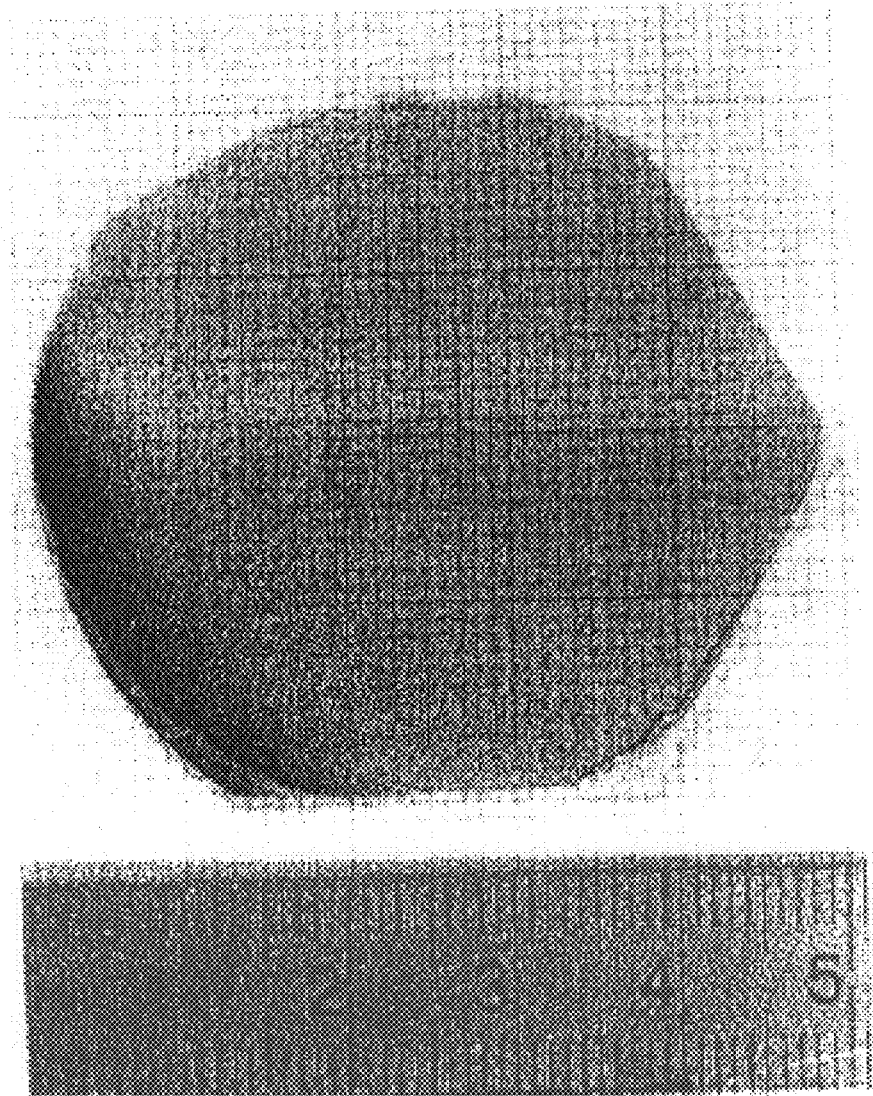
FIG. 4 is a low magnification optical photograph of a resulting large-area crack-free GaN wafer of 250 μm thickness, containing approximately 10 cm$^2$ of crack-free material in the right-hand portion of the wafer.

FIG. 4 shows a low magnification optical photograph of a resulting large-area crack-free GaN material of 250 $\mu$m thickness produced according to the present invention. Implementation of the thermal decomposition procedure was carried out using a Q-switched Nd:Yag laser (wavelength=355 nm). The free-standing GaN material shown in this photograph contains approximately 10 $cm^2$ of crack-free material in the right hand portion (grid elements in the photograph are 1 mm×1 mm) and has a defect density less than $5\times10^6$ $cm^{-2}$ at the upper surface of the GaN. The GaN shown in FIG. 4 is transparent and the surface is specular to the eye. The resulting wafer is not fragile, can be easily handled and cleaved. Such free-standing films represent a significant advance in the art of production of (Ga, Al, In)N materials. The substrate upon which the (Ga,Al,In)N material is deposited can be chosen to facilitate substrate removal.

The (Ga, Al, In)N material of the invention may be formed on a substrate, either with or without growth nucleation, surface preparation of the substrate, buffer layer (s), and/or use of intermediate layers between the (Ga,Al,In)N material and the substrate, as may be necessary or desirable in a given embodiment of the invention. Further, it may be desirable in the broad practice of the present invention to select the substrate and/or provide one or more interlayers between the substrate and (Ga, Al, In)N material, to protect the substrate and the (Ga,Al,In)N material from adverse effects during fabrication. The interlayers are also employed to control the growth nucleation, structural properties or electrical properties of the (Ga, Al, In) N material.

With respect to the temperatures referred to herein, the same are appropriately measured via a quartz-shielded thermocouple that is placed 0.4 to 0.6 inches behind the growth template, to ensure accuracy and reproducibility, in view of the significant temperature gradients that typically exist in growth furnaces that are employed for formation of (Ga, Al, In)N materials.

As used herein, the term "large area" refers to a material having a surface area at least 1 $cm^2$., more preferably greater than 10 $cm^2$, and most preferably greater than 20 $cm^2$. The term "free-standing" means that the material is self-supporting in character, and does not have an associated substrate or support in such form.

As used herein, the term "low defect density" means a defect density of less than $1\times10^7$ defects/$cm^2$.

The present invention may be practiced as hereinafter more fully described, to form the low defect density (Ga, Al, In)N material. It will be recognized that the defect density will to some extent be affected by the purity of the reagents employed in the HVPE reaction, and the purity of the reagents employed—the (Ga, Al, In) chloride material, (Ga, Al,In) metal material and/or the nitrogen-containing material—should be as high as possible, desirably at least "5–9" purity (i.e., at least 99.99999% by weight pure component) and more preferably at least "7–9" purity (i.e., at least 99.9999999% by weight pure component). At such purity levels, it is preferred to operate in a temperature and growth rate regime that will ensure the production of the low defect density (Ga, Al, In)N material at a level below $10^7$ defects/$cm^2$. It will be recognized that such temperature and/or growth rate regime may be widely varied to achieve this result. As an example of illustrative conditions that may be advantageously employed to achieve this result for GaN material, the temperature of the HVPE growth process may be in the vicinity of 1000° C., as for example from about 950° C. to about 1010° C., at growth rates of at least 25 micrometers per hour. The growth rate may for example be from about 25 micrometers to about 200 micrometers per hour, at a pressure which does not significantly exceed atmospheric pressure, e.g., which may range from about 10 to about 760 torr, or a superatmospheric pressure, e.g., in the range of from about 760 torr to about 1000 torr.

To achieve composition control and high quality material, In-containing and Al-containing alloys require lower (500–800° C.) and higher (1000 to 1300° C.) growth temperatures, respectively.

The prior art has not utilized such combinations of growth conditions to achieve low defect density (Ga, Al, In)N materials, with a defect density below $10^7$ defects/$cm^2$ and more preferably below $10^6$ defects/$cm^2$, such as (Ga, Al, In)N materials of such low defect density character whose defects are predominantly threading dislocations (TDs) that are angled with respect to the growth direction.

Contrary to the practice of the present invention, the state of the art in the field of growing (Ga, Al, In)N material at low defect density levels has generally favored very different growth process conditions than those described above for practice of the present invention.

For example, considering only growth temperature as a process variable, the art has typically used higher growth temperatures than those employed in the practice of the present invention, based on the premise that higher growth temperatures (greater than ~1030° C.) provide smoother surface morphology, better crystallinity and better or equal optical properties than lower growth temperatures such as those in the vicinity of 1000° C. that are preferably employed to cause the angled dislocations in the practice of the present invention.

However, it has been demonstrated in our prior work that in films of GaN grown on (0001) sapphire at 1050° C., defects are oriented along the [0001] direction and result in a relatively higher defect density than films grown at 1000° C., due to the formation of angled dislocations for the latter low surface mobility conditions. Such low defect density material is produced under film growth process conditions that differ from those employed in the prior art, generally involving significantly lower growth temperatures (e.g., around 1000° C.) than employed in the art, and producing a different and substantially lower defect density material.

It is to be acknowledged that some experimental work involving the formation of Group III-V metal nitrides, as conducted by researchers in the 1960s to 1970s, used lower temperatures of 900 to 1000° C. and some more recent work in the 1990s has utilized growth temperatures in the vicinity of 1000° C., but such work has employed different process conditions than the present invention, such as the ratio of precursors for vapor-phase film formation (e.g., GaCl and nitrogenous reagents in the case of GaN formation), growth pressures and growth rates, pressures and reagents.

As a result, the prior art has failed to produce the strikingly low defect density that is achieved by the present invention.

Additionally, in some instances, the prior art has attempted the production of low defect density Group III-V nitride material on patterned substrates, but such attempts have been unsuccessful in producing a low defect density (less than $10^7$ cm$^{-2}$) that is homogeneous over a large area (greater than 1 cm×1 cm) of the material.

By contrast, the present invention permits low defect density (Ga, Al, In)nitride material to be produced in bulk form having a high degree of homogeneity in defect density.

As used in such context, the term "bulk" means that in a (Ga, Al, In)N material of three-dimensional (x, y, z) character, the (Ga, Al, In)nitride material in each of the x and y directions is at least 10 millimeters, and more preferably greater than 20 millimeters, and most preferably greater than 40 millimeters in length and the (Ga, Al, In)N material in the z direction is at least 10 microns, and preferably greater than 100 microns, in height. In this respect of homogeneity of defect morphology, the bulk materials of the present invention are to be distinguished from prior art production of materials having a significant x,y dimensional extent and carried out by lateral epitaxy techniques.

In a highly preferred embodiment of the invention, for growth of low defect density ($3 \times 10^6$ defects/cm$^2$) GaN on sapphire, Table I below sets out potentially useful process conditions, including the specific process conditions employed for production of such material (each denoted as "Value" for the associated respective process variable), and the corresponding preferred operating range ("Operating range"), together with applicable commentary ("Comments").

TABLE I

| Description | Temperature (C) | Growth Rate (um/hr) | Pressure (Torr) | NH$_3$/HCl ratio |
|---|---|---|---|---|
| Value | 1000 | 100 | 50 | 32 |
| Operating range | 985–1010 | 50–150 | 10–800 | 20–40 |
| Comments | * | | ** | *** |

*Temperature depends on configuration and method of measurement
**A large range of growth pressure is intended, but other growth conditions must be modified along with the growth pressure.
***NH$_3$/HCl ratio towards the lower side of the range are more desirable.

A larger range of each of the variables in the previous table may be usefully employed in the broad practice of the present invention, but there is a trade-off between them, as described below.

At the extremely fast growth rates and lower than traditional growth temperatures that are employed in the practice of the present invention to form low defect density materials, the time that a reactant molecule has available for incorporation into the crystal lattice is short compared with the surface mobility involved. Although the molecules incorporate, they do not have sufficient time to "find" the most thermodynamically stable site.

Consequently, there is a trade-off between growth rate and mobility of adsorbed surface species. For a given growth rate, there is a small window of growth temperatures, growth pressures and NH$_3$/HCl ratios that balance this trade-off.

In general, when deviating from traditional optimal conditions in the practice of the present invention, one may reduce the surface mobility by decreasing growth temperature, decreasing NH$_3$ flow (since Group III precursor flow directly effects growth rate), and/or increasing growth pressure. One may therefore selectively vary these process parameters to achieve a desired reduction of the surface mobility characteristic in the growth system, and to achieve a desired low defect density character of the (Ga, Al, In)N material being formed on the substrate.

In this respect, low surface mobility conditions enhance the quantity and angle of tilted dislocations.

In another aspect, the present invention contemplates a two-stage growth process for the production of a low defect density (Ga, Al, In)N material, wherein each stage has a different growth temperature regime, the first stage being a lower temperature regime, e.g., in the range for GaN, for example, of from about 950° C. to about 1010° C., and more preferably from about 985° C. to about 1010° C., and the second stage being a higher temperature regime, e.g., in the range of from about 1020° C. to about 1200° C. By such ramping of the growth temperature (and manipulation of the growth rate-to-surface mobility tradeoff) from a low level (to achieve a low defect density) to a high level (to smooth out surface morphology and improve electrical properties), a superior low defect density (Ga, Al, In)N material can be produced. Note that the temperature at which the first stage is carried out is hundreds of °C. higher than prior art two stage growth methods.

Concerning the ramped growth process according to the present invention, as referred to hereinearlier, growth temperatures for GaN on the order of 1000° C. may be employed in accordance with the invention, to yield a GaN material which has a low TD defect density (on the order of $10^6$ cm$^{-2}$) with a large density (~$10^6$ cm$^{-2}$) of hexagonal surface pits, with depth as large as 10 to 30 microns. Such material may however possess a high background electron concentration, which in the case of subsequent doping of the film for device manufacture, makes it difficult to control conductivity through the doping process. Growth temperatures on the order of 1050° C. may be used as a "fix" relative to such deficiency, to fill in pits, and lower background electron concentration, but such growth temperature conditions do not achieve lower defect densities.

The two-stage ramped temperature process of the present invention may be employed to overcome such difficulties. In such process for the production of a low defect density GaN material, for example, the first stage temperature regime preferably is in the range of from about 950° C. to about 1010° C., and more preferably from about 985° C. to about 1010° C. The second stage temperature regime is preferably in the range of from about 1020° C. to about 1200° C. This process achieves a superior surface morphology and improved electrical properties, as well as a low defect density (Ga, Al, In) nitride material.

As an example of such two-stage process, the first stage may be carried out to conduct HVPE formation of the (Ga, Al, In) nitride material at a temperature of 1000° C. for a period of two hours, to achieve a low defect density material, followed by growth in the second step at a temperature of 1050° C. to attain smoother surface and lower electrical characteristics of the product film material.

Concerning the morphology characteristics of the film material in the formation of GaN, and the aforementioned production of pits, we hypothesized that the hexagonal pits are caused by limited surface mobility of the Ga and N growth constituents. To test this theory, we examined the effect of surface mobility on the surface morphology of a low defect density HVPE material. Increased growth temperature increases the mobility of adsorbed species on the growth surface. Thus, HVPE overgrowth was carried out at higher temperatures on HVPE samples with a high hexagonal pit density to determine the extent of in-fill of the pits.

In a specific embodiment of such ramped process, the first and second stages of the process preferably are continuous, and the temperature is ramped from the first stage temperature to the second stage temperature, whereby growth of the (Ga, Al, In)N material is continuous through progress of the first and second stages. The process may be conducted to yield a product (Ga, Al, In)N material having a pit density on a top surface thereof that is less than about 100 cm$^{-2}$. The first stage of the process may be conducted to yield a (Ga, Al, In)N material having a thickness of at least 100 μm, and more preferably greater than 200 μm, to minimize the likelihood of cracking of the (Ga, Al, In)N film in the higher temperature second stage of the process.

FIG. 5 is a Nomarski interference-contrast microscope image of the surface of (a) a 200 μm thick HVPE GaN film grown on sapphire under low surface mobility conditions, and (b) the identical area after 20 additional microns of HVPE growth under high surface mobility conditions.

Figure 5A:
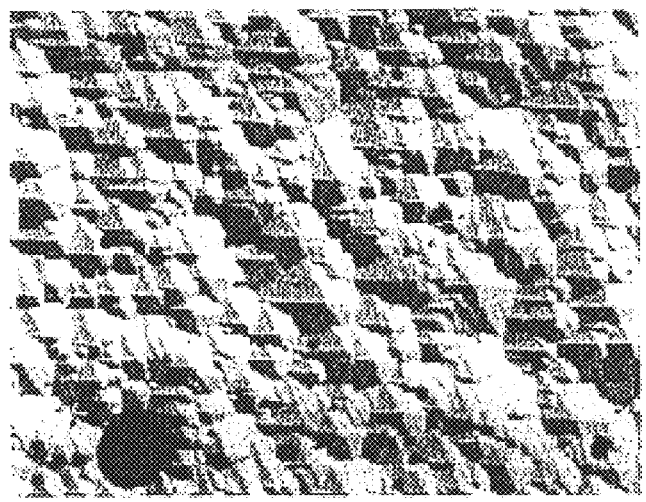
FIG. 5 is a Nomarski interference-contrast microscope image at 255 times magnification, of the surface of (a) a 200 μm thick HVPE GaN film grown on sapphire under low surface mobility conditions (including a growth temperature of 1000° C.), and (b) the identical area after 20 additional microns of HVPE growth under higher surface mobility conditions (including a growth temperature of 1050° C.).

The surface of the starting GaN film is shown in FIG. 5(a). The size and density of the hexagonal pits vary in the images shown. For this sample, the largest pits were as large as 20 microns in area and depth and the overall hexagonal pit density was approximately $10^6$ cm$^{-2}$. The larger pits shown in FIG. 5 were used as a reference for comparison after overgrowth.

Figure 5B:
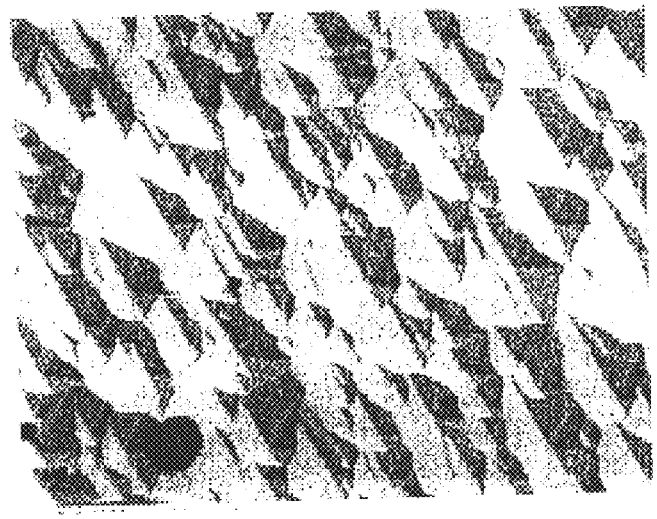

Higher temperature (high surface mobility) growth conditions were found to improve the surface morphology of the low defect density HVPE material. After 20 microns (10 minutes) of HVPE growth, the hexagonal pits were noticeably filled. FIG. 5(b) shows the surfaces after an additional 20 μm of growth for the identical areas on the wafer shown in FIG. 5(a). These photos show that the smaller pits were completely filled in, while the largest pits were made smaller.

These results verify that low temperature (low surface mobility) HVPE growth of GaN leads to the pit formation. However, low temperature (low surface mobility) nucleation is important for achieving low defect density. By combining low temperature nucleation with the subsequent high temperature surface smoothing growth, smooth, low pit density, low defect density GaN-on-sapphire wafers were produced. Dislocation densities less than 5×$10^6$ cm$^{-2}$ and pit densities less than 50 cm$^{-2}$ have been achieved by this two staged growth process.

The overall surface of the HVPE GaN formed in accordance with the present invention is suitable for epitaxial growth.

Figure 6:
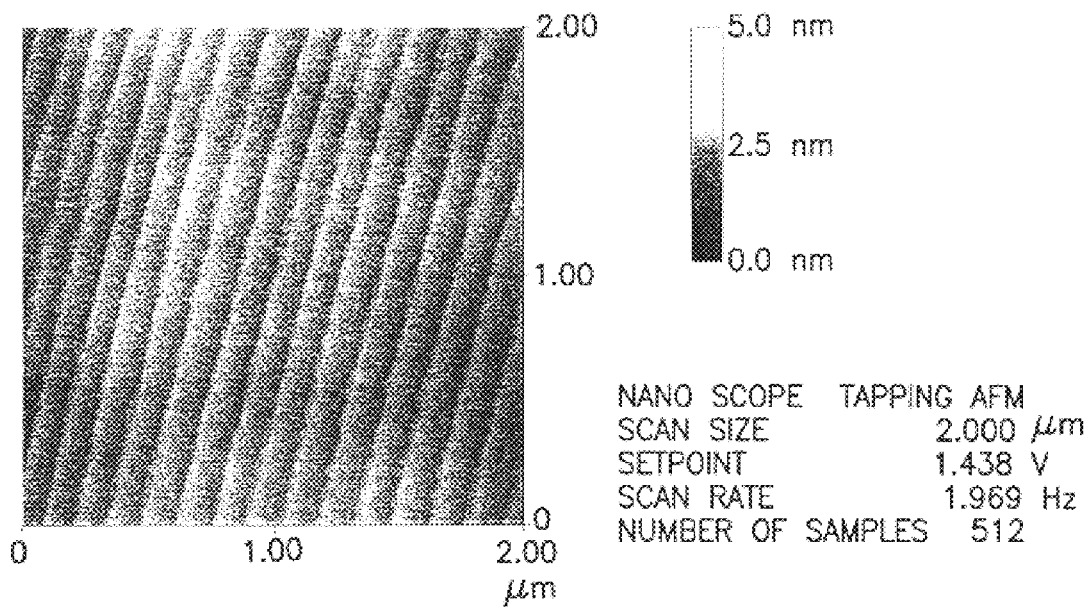
FIG. 6 shows an atomic force microscope (AFM) image of a 2 micron by 2 micron area of a MOVPE GaN film grown on a low defect density HVPE GaN-on-sapphire wafer.

FIG. 6 shows an AFM image of a 2 micron by 2 micron area of a 7 microns thick MOVPE GaN film grown on 200 microns thickness of a low defect density HVPE GaN-on-sapphire wafer. The root mean square (RMS) roughness of the area shown is ~0.17 nm. The MOVPE GaN film is 7 microns thick and is uncracked, indicating that the stress in the GaN-on-sapphire has been released before MOVPE growth. These results show that high quality epitaxial growth and device layer growth are achievable on the HVPE low defect density material of the present invention.

The substrate for the (Ga, Al, In) N composition in the broad practice of the invention may be formed of any suitable material. Examples include sapphire, silicon, silicon carbide, diamond, lithium gallate, lithium aluminate, zinc oxide, spinel, magnesium oxide, gallium arsenide, silicon-on-insulator, carbonized silicon-on-insulator, gallium nitride, etc., including conductive as well as insulating and semi-insulating substrates, twist-bonded substrates, compliant substrates, etc. The substrate may be patterned, e.g., with a dielectric such as SiO$_2$, to permit direct growth on specific regions of the substrate. Patterning could also be carried out on an intermediate layer between the substrate and the (Ga, Al, In) N material to be grown. In either case, the HVPE process may be carried out to grow the (Ga, Al, In) N material over the dielectric.

The low defect density material of the invention may be formed by growing a (Ga, Al, In) N film on a compatible substrate by HVPE at low surface mobility growth conditions for sufficient time and under sufficient growth conditions to produce a (Ga, Al, In) N film whose defects are predominantly threading dislocations angled with respect to the growth direction.

The optimum process conditions for growth of the (Ga, Al, In) N material may be determined as described in the "Summary of the Invention" section hereof, to first define the value of the growth process variable (e.g., growth temperature, ratio of precursors for vapor-phase film formation, growth pressure and growth rate), at which the traditional surface morphology, crystallinity and defect density are obtained for thinner growth layers (less than 10 microns). After the traditional optimal process condition of the selected process variable is determined, the desired low surface mobility process condition for the selected variable in the vicinity of the traditional optimal value, can be established, at which the defects in the vicinity of the film/substrate interface is a denser network of tangled defects (mixed defects) which transition with increasing film thickness to defects which are predominantly threading dislocations angled with respect to the growth direction.

An optimal set of process conditions is amenable to identification by appropriate correlation to the x-ray rocking curves for the product material resulting from the process, which then can be used to determine appropriate low surface mobility (low defect density, angled dislocation) condition (s). Such identification may therefore involve a correlation which establishes appropriate confidence levels (coefficients of variation) for the spread in double crystal x-ray rocking curve (DCRC) full width at half maximum (FWHM) values at a given set of process conditions and film thickness. By way of specific example, for 10 μm thick GaN films on (0001) sapphire, traditional optimal DCRC FWHM is generally in the range of from about 200 to about 400 arcsec, and more typically in the range of from about 250–350 arcsec, with suitable low surface mobility process conditions producing samples with 50–250 arcsec higher values, e.g., in the range of from about 350 to about 600 arcsec.

As mentioned earlier herein in the "Background of the Invention" section hereof, the art has disclosed growth processes for forming gallium nitride by techniques such as MOVPE and HVPE which produce dislocations parallel to the growth direction.

For example, W. Qian, et al., Appl. Phys. Lett. 66 (1995) 1252 disclose that for GaN on (0001) sapphire and (11-20) sapphire: "[t]he defects which penetrate the GaN films are predominantly perfect edge dislocations with Burgers vectors of the 1/3<11-20> type, lying along the [0001] growth direction . . . [t]he nature of these threading dislocations suggests that the defect density would not likely decrease appreciably at increased film thickness . . . [t]he x-ray rocking curves [(0004) reflection] taken on these samples have typical widths of 250–350 arcsec."

B. Heying, et al., Appl. Phys. Lett. 68 (1996) 643 describes GaN grown on (0001) sapphire which has been grown in two different MOVPE growth regimes. Although the types of dislocations are different, the threading dislocations in both cases, away from the film/substrate interface, have a [0001] line direction. This article asserts that x-ray measurements, such as may be employed in the practice of the present invention to identify an optimal process condition (symmetric rocking curve), is insensitive to edge type threading dislocations and is only sensitive to screw dislocation density. This characteristic, if accurate, is perhaps the reason for the utility of the sub-optimization procedure that may be usefully employed in the practice of the present invention, but we do not wish to be bound by any theory or possible mechanism, as regards the basis or rationale of operability of the practice of the present invention.

K. A. K Dunn, et al., Mat. Res. Soc. Proc. 482 (1998) 417) has reported TEM data from MOVPE and HVPE GaN films on (0001) sapphire, and describes threading dislocations away from the GaN/sapphire interface (>3 μm) that are "long, straight TDs whose tangent vectors are closely aligned with the growth direction and c-axis of the GaN." The HVPE material studied by Dunn et al. was grown at 1050° C. at 120 μm/hr (although the growth temperature was not specified in this article).

The (Ga, Al, In)N growth process of the present invention also achieves an advance over the prior art in the ability to form thick, crack-free (Ga, Al, In)N layers. Cracking is the result of substantial differences in thermal coefficient of expansion between the substrate and the film material being grown thereon, and adversely affects the film and performance properties of the resulting structure. The method of the present invention substantially overcomes cracking problems that have plagued prior art (Ga, Al, In)N materials by the use of lower temperatures in the growth process that enable the growth of thicker films with out cracking.

It is to be appreciated that the incidence and extent of cracking is highly dependent on temperature. The specific temperature and other process conditions usefully employed in the practice of the present invention to produce a low defect density material of desired crack-free character is readily empirically determinable by those of ordinary skill in the art, by selective variation of the process conditions and characterization of the resulting material with respect to its defect structure, defect density, and cracking susceptibility or cracked character.

Figure 7A:
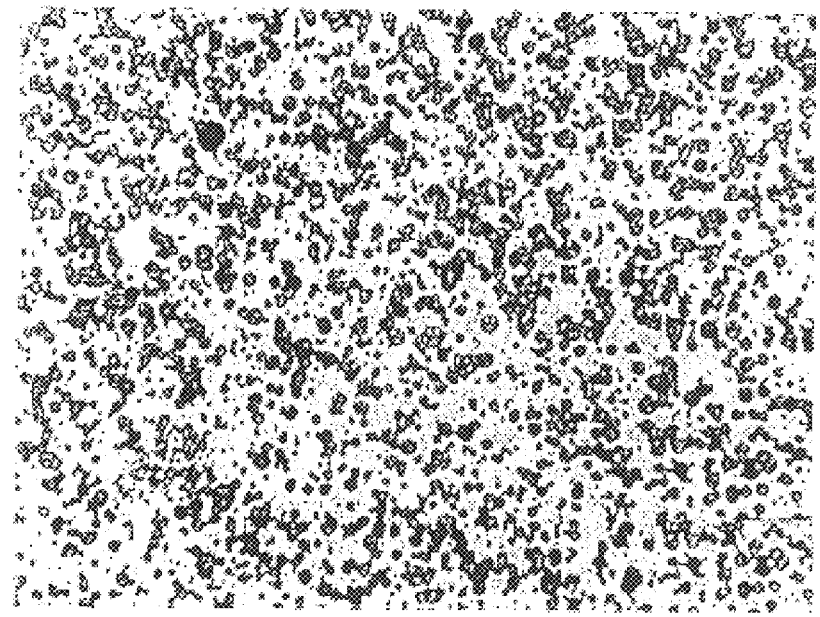
FIGS. 7A and 7B show (at 42.5 times magnification) corresponding 200 μm thick GaN films grown at a rate of 100 μm per hour, but with the film in FIG. 7A grown at 1000° C. and the film in FIG. 7B grown at 1010° C. 10° C. makes a large difference in terms of film cracking.
Figure 7B:

Lower surface mobility conditions (lower temperature) surface mobility conditions (lower temperature) have been found to be particularly critical in reducing film cracking. FIGS. 7A and 7B show (at 42.5 times magnification) corresponding 200 μm thick GaN films grown at a rate of 100 μm per hour, but with the film in FIG. 7A grown at 1000° C. and the film in FIG. 7B grown at 1010° C., showing the difference in cracking behavior attributable to a very small difference in growth temperature.

The (Ga, Al, In) N material may be formed by a HVPE growth process including reaction of vapor-phase (Ga, Al, In) chloride with a vapor-phase nitrogenous compound (e.g., ammonia, hydrazine, amines, polyamines, etc.) in the presence of the substrate, to grow the (Ga, Al, In) nitride material thereon. The vapor-phase gallium chloride may be formed by contacting vapor-phase hydrogen chloride with molten (Ga, Al, In) to yield the vapor-phase (Ga, Al, In) chloride, wherein the molten (Ga, Al, In) preferably has a purity of 99.99999$^+$%, and more preferably has a purity of 99.9999999$^+$%.

As an example of the HVPE process of the present invention, for formation of GaN on a substrate, HCl may be passed over a source of high purity gallium (Ga), to form volatile GaCl which is transported to a deposition zone where it reacts with ammonia ($NH_3$) to form GaN on the substrate.

An analogous sequence may be employed to transport In or Al which will allow the growth of (Ga, Al, In) N alloys.

The growth rate of the (Ga, Al, In) N material in the HVPE process of the invention may be any suitable film growth rate, e.g., at least 10 μm/hour, more preferably at least 50 μm/hour, and most preferably at least 100 μm/hour, to produce a (Ga, Al, In) N material with a low threading dislocation defect density, i.e., less than about $10^7$ threading dislocation defects/$cm^2$ at the upper surface of the (Ga, Al, In) N material, and more preferably less than about $10^6$ threading dislocation defects/$cm^2$ at the upper surface of the (Ga, Al, In)N material.

The (Ga, Al, In) N material grown by the method of the invention may be used as a substrate for fabrication thereon of a microelectronic device or a device precursor structure, by a process including deposition of device layers by a suitable deposition technique, e.g., metalorganic chemical vapor deposition (MOCVD), molecular-beam epitaxy (MBE), etc.

The (Ga, Al, In)N material of the present invention may be employed for the fabrication of a wide variety of optical and electrical devices, including laser diodes, LEDs, detectors, bipolar transistors, permeable base transistors, high electron mobility transistors (HEMTs), vertical MISFETs, Schottky rectifiers, etc.

Figure 8:
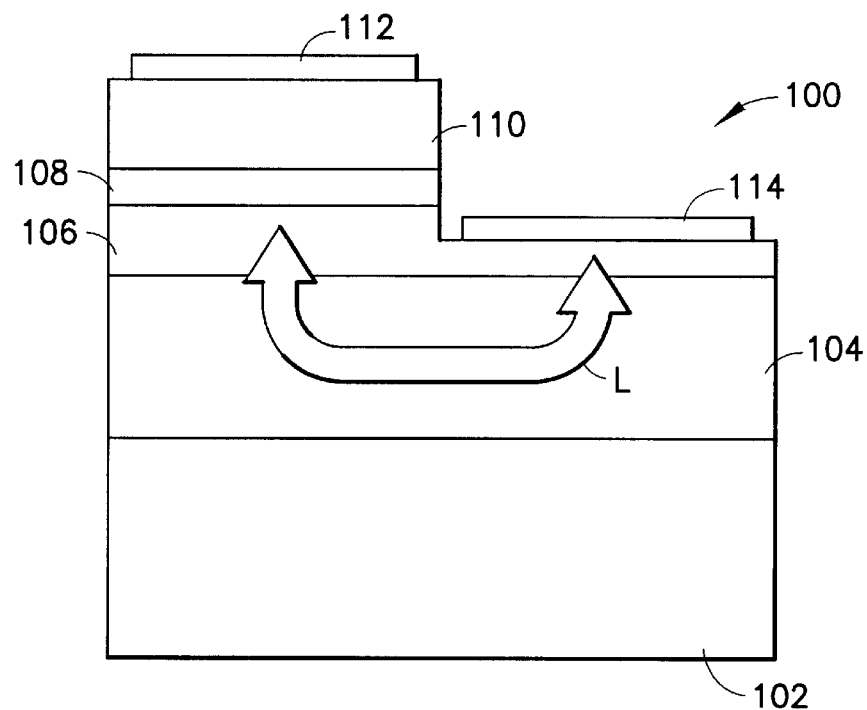
FIG. 8 is a schematic representation of a GaN/InGaN light emitting diode structure grown on an insulating substrate.

As an illustrative example of a device embodiment of the present invention, FIG. 8 is a schematic representation of a GaN/InGaN light emitting diode structure grown on an insulating substrate. Such GaN/InGaN LED structure 100 utilizes an insulating substrate 102 on which an n-type GaN HVPE base layer 104 is formed. The base layer is overlaid by an n-type GaN layer 106, an intermediate (InGa)N active layer 108 and an upper p-type GaN layer 110. The p-type GaN layer 110 has a p contact layer 112 formed thereon, and the lower n-type GaN layer 106 has an n contact layer 114 formed on the right-hand portion thereof, in the view shown. Such arrangement provides a lateral conduction path L. The conductance in the n-type layer is directly proportional to the thickness of that layer. Thus, the lateral conduction in a device of the type shown may be easily increased by 3–4 times by adding a 10–15 microns thick n-type GaN HVPE base layer to the original structure. In this device structure, the GaN and/or InGaN layers may be formed by HVPE in accordance with the invention.

Figure 9:
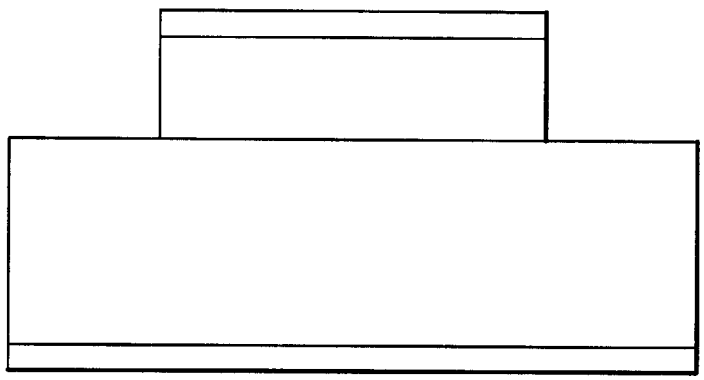
FIG. 9 is a schematic representation of high voltage GaN Schottky rectifier fabricated with free-standing HVPE GaN material.

As another illustrative example of a device embodiment of the present invention, FIG. 9 is a schematic representation of a high power GaN Schottky rectifier fabricated on free-standing GaN.

Recent research indicates that threading dislocations in nitride devices act as scattering and non-radiative recombination centers that degrade device performance. Accordingly, the low defect density (Ga, Al, In)N material of the present invention achieves a substantial advance in the art.

The (Ga, Al, In)N material of the present invention may be employed as a substrate for epitaxial growth, e.g., for the fabrication of Group III-V nitride devices of widely varying type.

In addition to the foregoing discussion herein of the failure of the art to produce the angled dislocation growth of (Ga, Al, In)N material of the invention, and the teachings of the prior art that contraindicate the temperatures and other process conditions used in the practice of the present invention, to be noted that the lower processing temperatures employed in the present invention are also contraindicated by DCRC and surface morphology studies.

Figure 10:
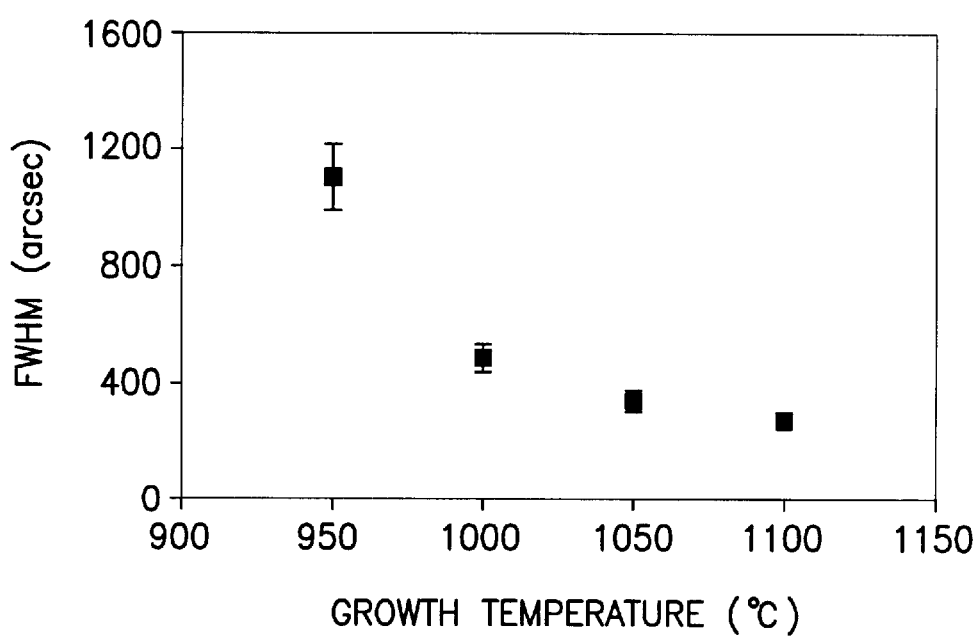
FIG. 10 is a plot of double crystal x-ray rocking curve full width at half maximum, in arcseconds, as a function of growth temperature for a series of 10 μm thick GaN films grown on (0001) sapphire by HVPE.

As shown by FIG. 10, which is a plot of double crystal x-ray rocking curve full width half mean, in arcseconds, as a function of growth temperature for a series of 10 µm thick GaN films grown on (0001) sapphire by HVPE, wherein temperature was the only parameter varied for successive test runs, higher temperature yields better crystallinity, as evidenced by the reduced FWHM at increasingly higher temperature.

Morphological studies are also suggestive that the higher temperatures of the prior art are more beneficial, and that the lower temperatures characteristic of the present invention are less desirable.

Figure 11:
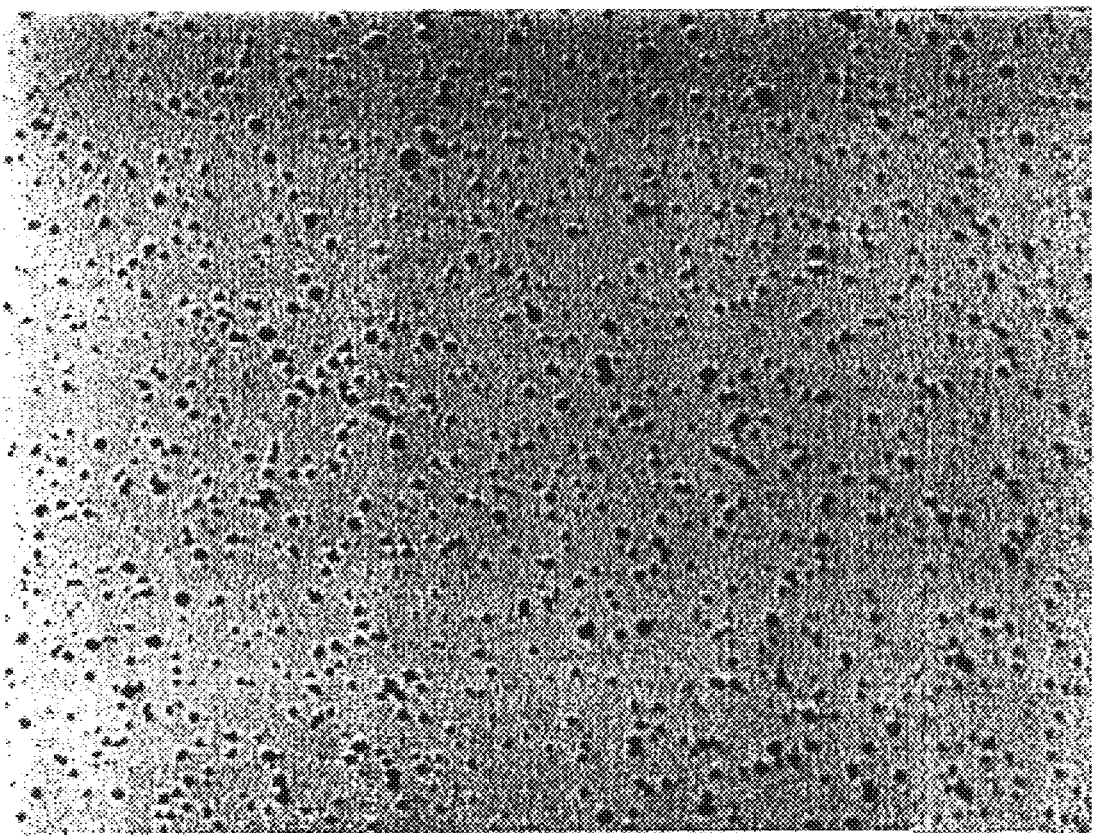
FIG. 11 is a optical microscope image at 645 times magnification, showing a 10 μm film of GaN grown at a temperature of 1000° C. by HVPE at a growth rate of 120 μm per hour (low surface mobility conditions), and revealing the surface pit structure of the resulting material.
Figure 12:
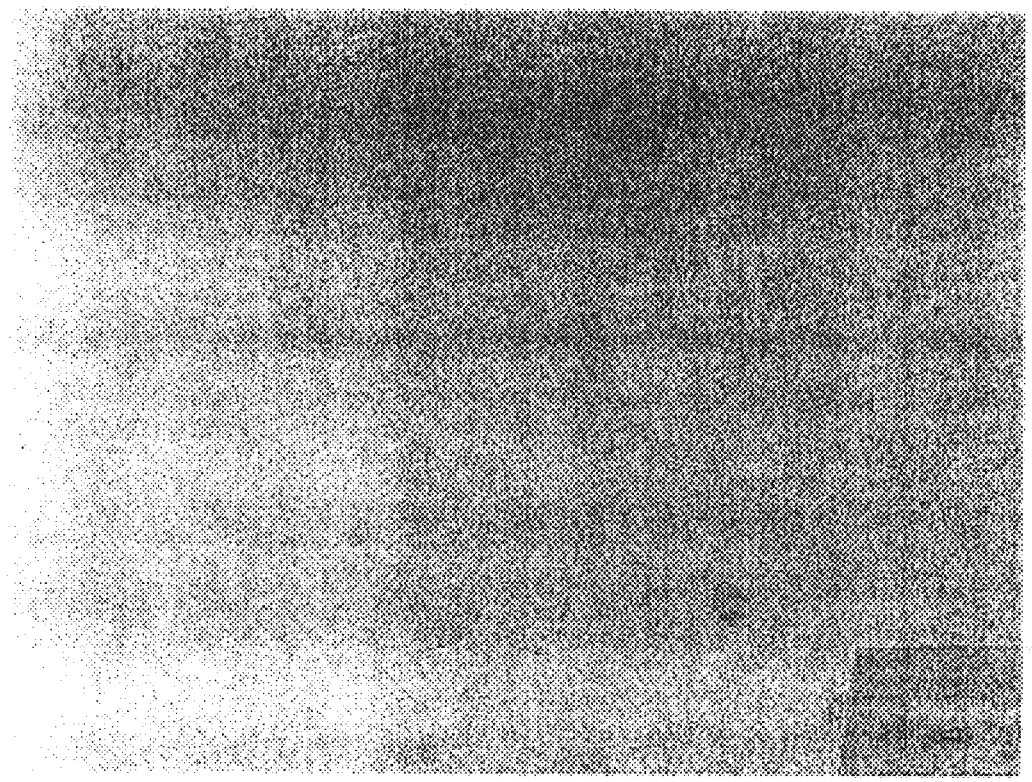
FIG. 12 is a optical microscope image at 645 times magnification, of a corresponding 10 μm film of GaN grown at a temperature of 1050° C. by HVPE but otherwise at the same process conditions used to produce the GaN sample of FIG. 11 (traditional optimal conditions).

FIG. 11 is an optical microscope image at 645 times magnification, showing a 10 µm film of GaN grown at a temperature of 1000° C. (low surface mobility conditins) by HVPE at a growth rate of 120 µm per hour, and revealing the surface pit structure of the resulting material. FIG. 12 is an optical microscope image at 645 times magnification, of a corresponding 10 µm film of GaN grown at a temperature of 1050° C. (higher surface mobility) by HVPE but otherwise at the same process conditions used to produce the GaN sample of FIG. 11. The FIG. 12 micrograph shows a much smoother surface than that of the lower temperature sample in FIG. 11 and the relative scarcity of pits. Thus, morphological considerations suggest away from the lower temperature regime that is employed in the process of the present invention.

The present invention provides a technique for producing large area, substantially crack-free, low defect density, free standing (Ga, Al, In)N substrates, e.g., of GaN.

While the invention has been described herein with respect to specific features, embodiments and aspects, it will be appreciated that the invention is not thus limited, and contemplates other variations, modifications and additional embodiments. Accordingly, the invention hereafter claimed is to be broadly construed, to encompass all such variation, modifications and alternative embodiment within its spirit and scope.

What is claimed is:

1. A method of forming a GaN material, comprising growing the GaN material by a HVPE growth process using $NH_3$, HCl and Ga as reactants, wherein the HVPE growth process is carried out at a temperature in the range of from about 985° C. to about 1010° C., at a growth rate of from about 50 to about 150 µm per hour, a pressure of from about 10 to about 800 torr, and a $NH_3$/HCl ratio of from about 20 to about 40, so that the formed GaN material includes dislocations that are predominantly angled with respect to the growth direction by a tilt angle that is in the range of 0.1 to about 40, and wherein the formed GaN material has a dislocation defect density of $10^7$/ $cm^2$ or lower.

2. A method according to claim 1, wherein the temperature is about 1000° C.

3. A method according to claim 1, wherein the growth rate is about 100 µm per hour.

4. A method according to claim 1, wherein the pressure is about 50 torr.

5. A method according to claim 1, wherein the $NH_3$/HCl ratio is about 32.

6. A method according to claim 1, wherein the $NH_3$/HCl ratio is maintained so that growth of the GaN occurs with $NH_3$/HCl ratio less than 32.

7. An HVPE process for forming a low defect density (Ga, Al, In)nitride material, said process comprising (1) a first stage comprising depositing (Ga, Al, In)N material on a substrate at a temperature in the range of from about 950° C. to about 1020° C., and forming a (Ga, Al, In)N material having a dislocation density of $10^7$ defects/$cm^2$ or lower, with said (Ga, Al, In)N material having pits on an upper surface of said material at the conclusion of the first stage of the process, and (2) a second stage comprising depositing (Ga, Al, In)nitride material on the (Ga, Al, In)nitride material that was deposited in the first stage of the process, wherein said second stage is conducted at a temperature in the range of from about 1020° C. to about 1250° C. for sufficient time to at least partially fill pits formed on the surface of the (Ga, Al, In)N material in the first stage of the process.

8. An HVPE process according to claim 7, wherein the second stage of the process is conducted at a temperature of about 1050° C.

9. An HVPE process according to claim 7, wherein the second stage of the process is conducted at process conditions that lower the background carrier concentration relative to the (Ga, Al, In)N material at the conclusion of the first stage of the process.

10. An HVPE process according to claim 7, wherein the first stage of the process is carried out for sufficient time to growth the (Ga, Al, In)N material to a thickness of at least 100 µm, to thereby render subsequent growth of (Ga, Al, In)N material in the second stage of the process free of cracking.

11. An HVPE process according to claim 7, wherein the temperature in the process is ramped from the first stage temperature to the second stage temperature while growth is continued.

12. An HVPE process according to claim 7, wherein the temperature in the first stage is in the range of from 985° C. to about 1010° C., the growth rate is from about 50 to about 150 µm per hour, and the pressure is in the range of from about 10 to about 800 torr.

13. An HVPE process according to claim 7, wherein the temperature in the first stage is about 1000° C., the growth rate is about 100 µm per hour, and the pressure is about 50 torr.

14. An HVPE process according to claim 7, wherein the process reactants include $NH_3$ and HCl, and the ratio of $NH_3$/HCl is in the range of from about 20 to 40.

15. An HVPE process according to claim 14, wherein the ratio of $NH_3$/HCl is less than about 35.

16. An HVPE process according to claim 7, wherein the process reactants include $NH_3$/HCl, and the ratio of $NH_3$/HCl is less than 32.

17. A process according to claim 7, that is conducted to yield a product comprising (Ga, Al, In)N material having a pit density on a top surface thereof that is less than about 100 $cm^{-2}$.

* * * * *